US011728188B2

(12) United States Patent
Hashimoto et al.

(10) Patent No.: US 11,728,188 B2
(45) Date of Patent: Aug. 15, 2023

(54) SEMICONDUCTOR MANUFACTURING DEVICE

(71) Applicant: Kioxia Corporation, Minato-ku (JP)

(72) Inventors: Yuji Hashimoto, Kuwana (JP);
Shinsuke Muraki, Kuwana (JP);
Hiroaki Yamada, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 291 days.

(21) Appl. No.: 16/941,661

(22) Filed: Jul. 29, 2020

(65) Prior Publication Data
US 2021/0057241 A1    Feb. 25, 2021

(30) Foreign Application Priority Data

Aug. 23, 2019   (JP) ................. 2019-153183

(51) Int. Cl.
*H01L 21/67*   (2006.01)
*B08B 3/08*    (2006.01)
*B08B 13/00*   (2006.01)
*B08B 3/10*    (2006.01)

(52) U.S. Cl.
CPC .......... *H01L 21/67126* (2013.01); *B08B 3/08* (2013.01); *B08B 3/106* (2013.01); *B08B 13/00* (2013.01); *H01L 21/6708* (2013.01); *H01L 21/67051* (2013.01); *H01L 21/67242* (2013.01); *H01L 21/67248* (2013.01); *B08B 2203/007* (2013.01); *H01L 21/67017* (2013.01); *H01L 21/67086* (2013.01); *H01L 21/67253* (2013.01)

(58) Field of Classification Search
CPC ......... H01L 21/67051; H01L 21/67248; H01L 21/67017; H01L 21/67253; H01L 21/67126; H01L 21/67242; H01L 21/6708; H01L 21/67086; B08B 13/00; B08B 3/08; B08B 3/106; B08B 2203/007
See application file for complete search history.

(56) References Cited

U.S. PATENT DOCUMENTS

| 6,656,281 | B1  |   | 12/2003 | Ueda et al. |
| 9,811,096 | B2  |   | 11/2017 | Hayashi et al. |
| 2002/0092547 | A1 | * | 7/2002 | You .................... H01L 21/67057 134/186 |
| 2004/0016447 | A1 | * | 1/2004 | Nagai ................ H01L 21/67057 134/201 |
| 2005/0039775 | A1 | * | 2/2005 | Whitlock ............ C11D 11/0047 134/25.4 |

(Continued)

FOREIGN PATENT DOCUMENTS

| JP | 4-171934 A | 6/1992 |
| JP | 5-251423 A | 9/1993 |

(Continued)

*Primary Examiner* — Benjamin L Osterhout
(74) *Attorney, Agent, or Firm* — Oblon, McClelland, Maier & Neustadt, L.L.P.

(57) ABSTRACT

According to one embodiment, a semiconductor manufacturing device includes a chemical solution preparation tank configured to prepare a solution; a chamber configured to discharge the chemical solution prepared at the chemical solution preparation tank to a substrate; a pressure sensor configured to measure a pressure inside the chemical solution preparation tank; and a variable opening valve arranged between the chemical solution preparation tank and an exhaust pipe.

18 Claims, 6 Drawing Sheets

(56) References Cited

U.S. PATENT DOCUMENTS

| | | | |
|---|---|---|---|
| 2007/0042511 A1 | 2/2007 | Abiko et al. | |
| 2012/0118822 A1* | 5/2012 | Strickland | F04B 15/023 |
| | | | 210/640 |
| 2012/0181239 A1* | 7/2012 | Furusho | H01L 21/6715 |
| | | | 210/97 |
| 2014/0174103 A1* | 6/2014 | Kalra | F23G 7/07 |
| | | | 62/46.1 |
| 2016/0062372 A1 | 3/2016 | Hayashi et al. | |
| 2016/0064213 A1* | 3/2016 | Sakai | H01L 21/67017 |
| | | | 134/22.18 |
| 2018/0158700 A1 | 6/2018 | Shomori. et al. | |
| 2019/0228990 A1 | 7/2019 | Hinode et al. | |
| 2019/0355574 A1* | 11/2019 | Kanno | H01L 21/67115 |

FOREIGN PATENT DOCUMENTS

| | | |
|---|---|---|
| JP | 10-15379 A | 1/1998 |
| JP | 2001-23892 A | 1/2001 |
| JP | 2001-57335 A | 2/2001 |
| JP | 2007-53282 A | 3/2007 |
| JP | 2015-177139 A | 10/2015 |
| JP | 2017-11051 A | 1/2017 |
| JP | 6155331 B2 | 6/2017 |

* cited by examiner

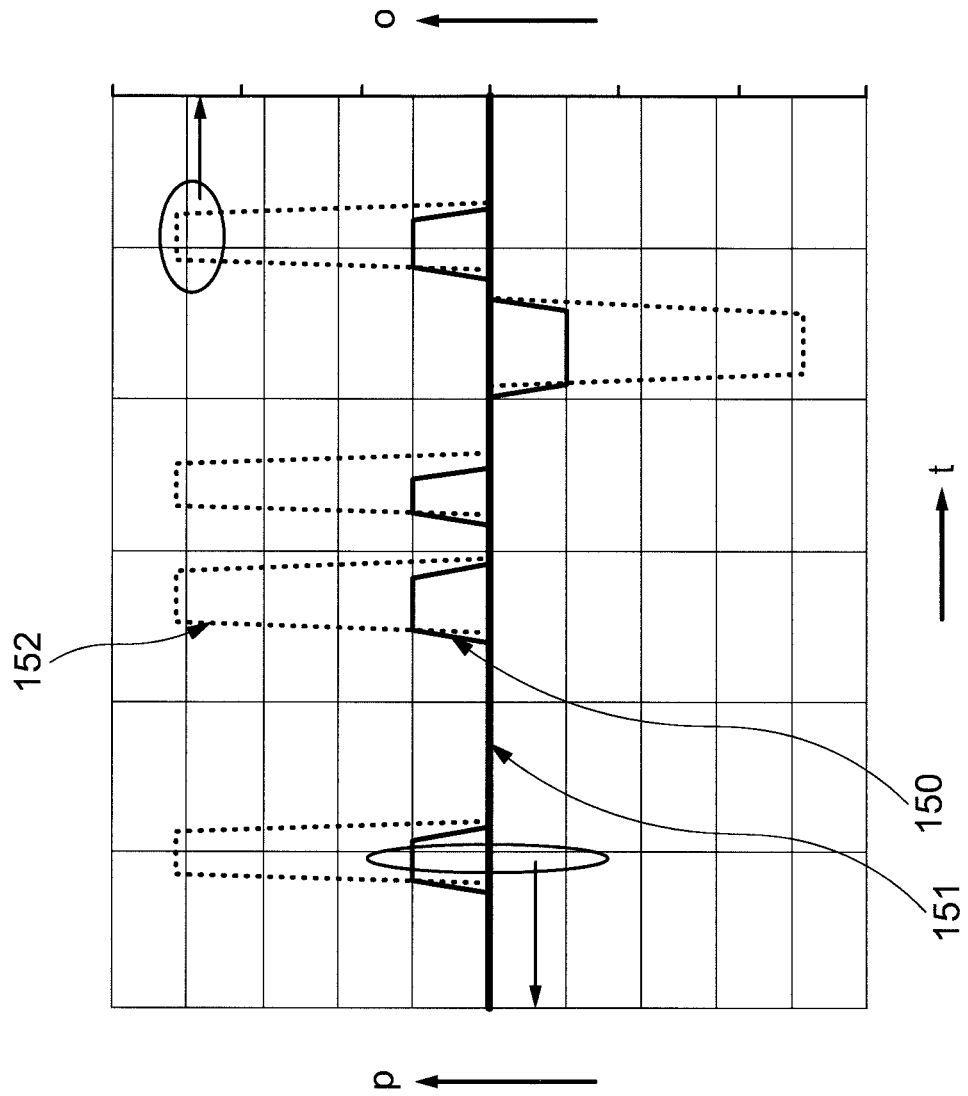

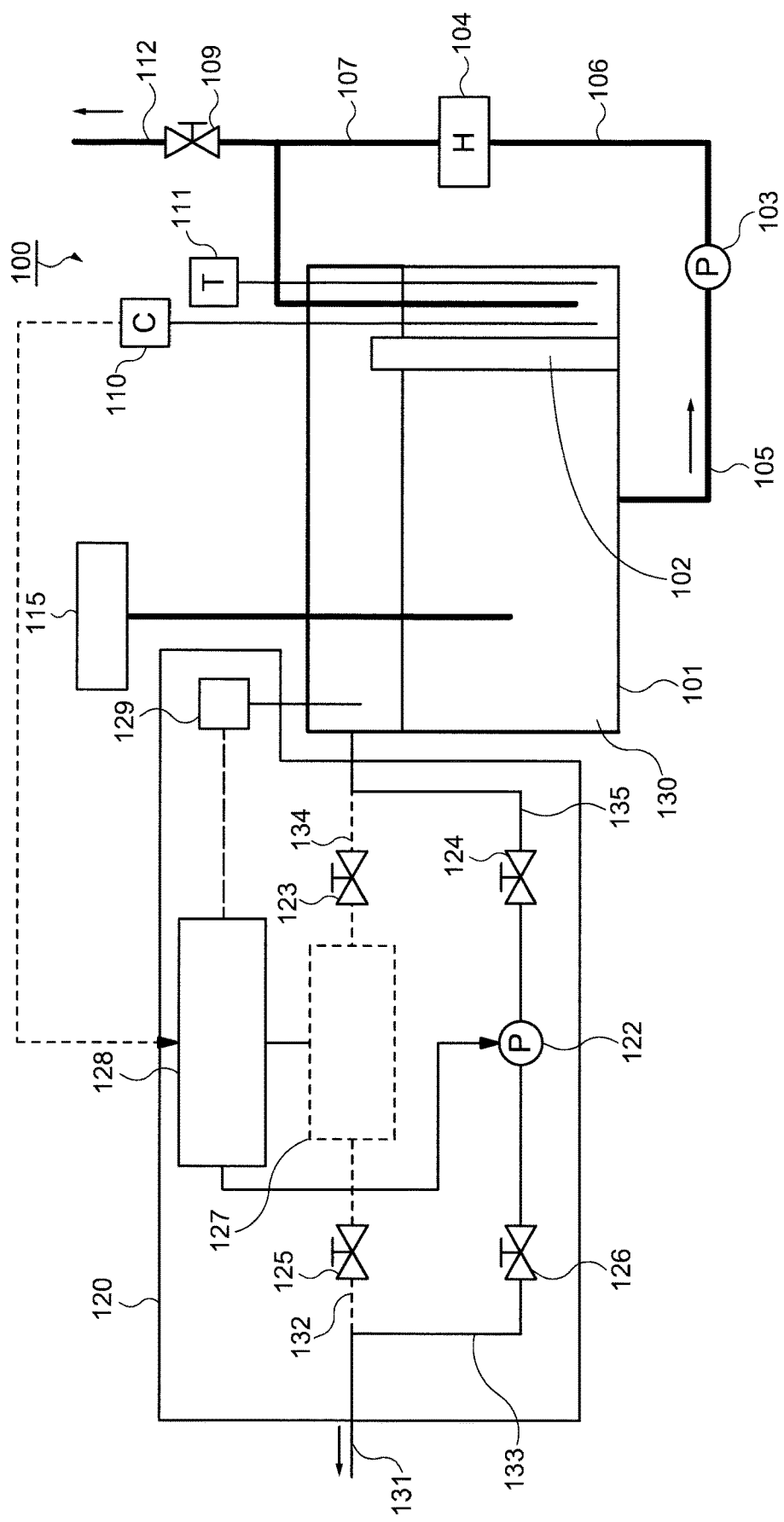

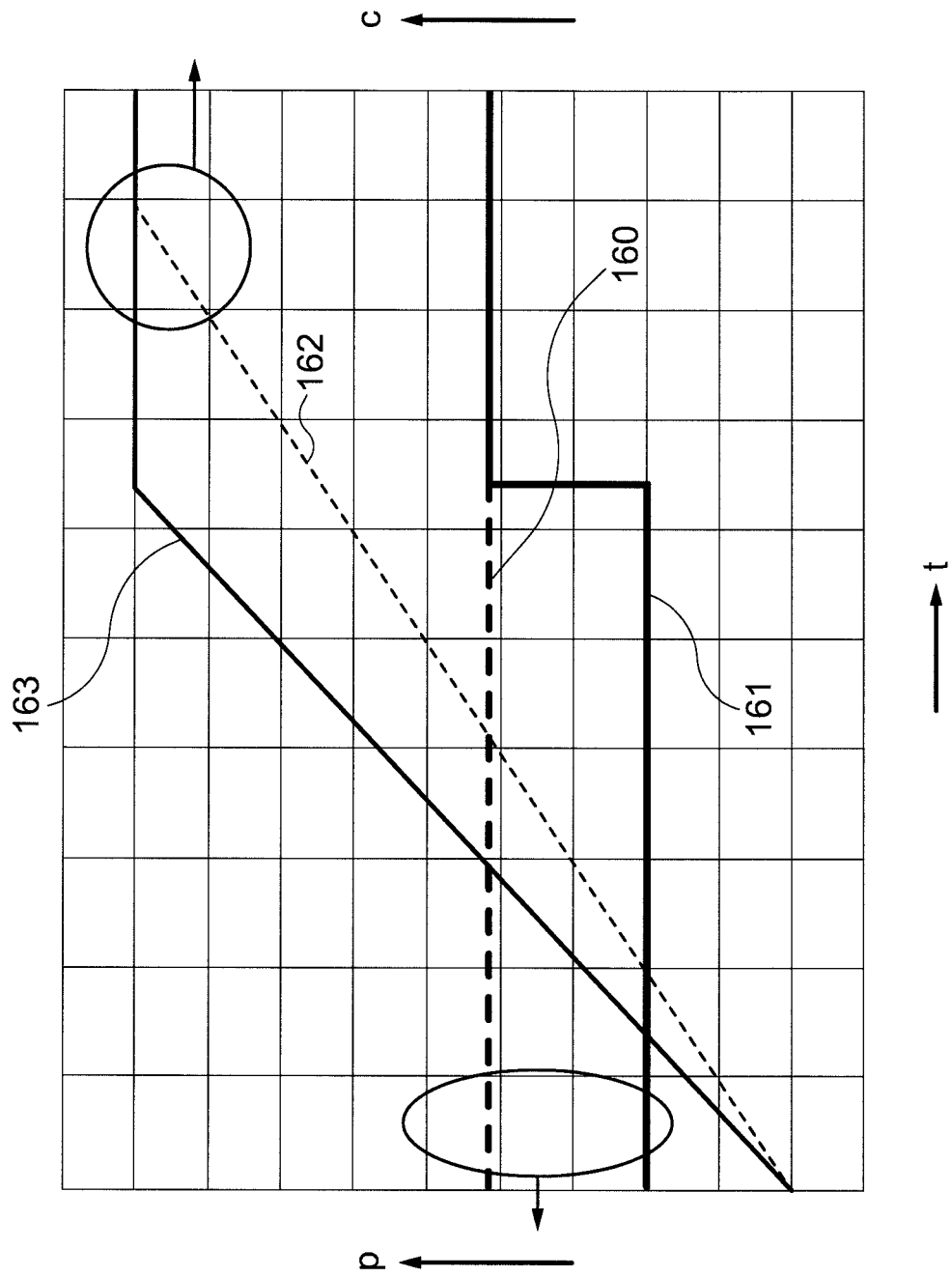

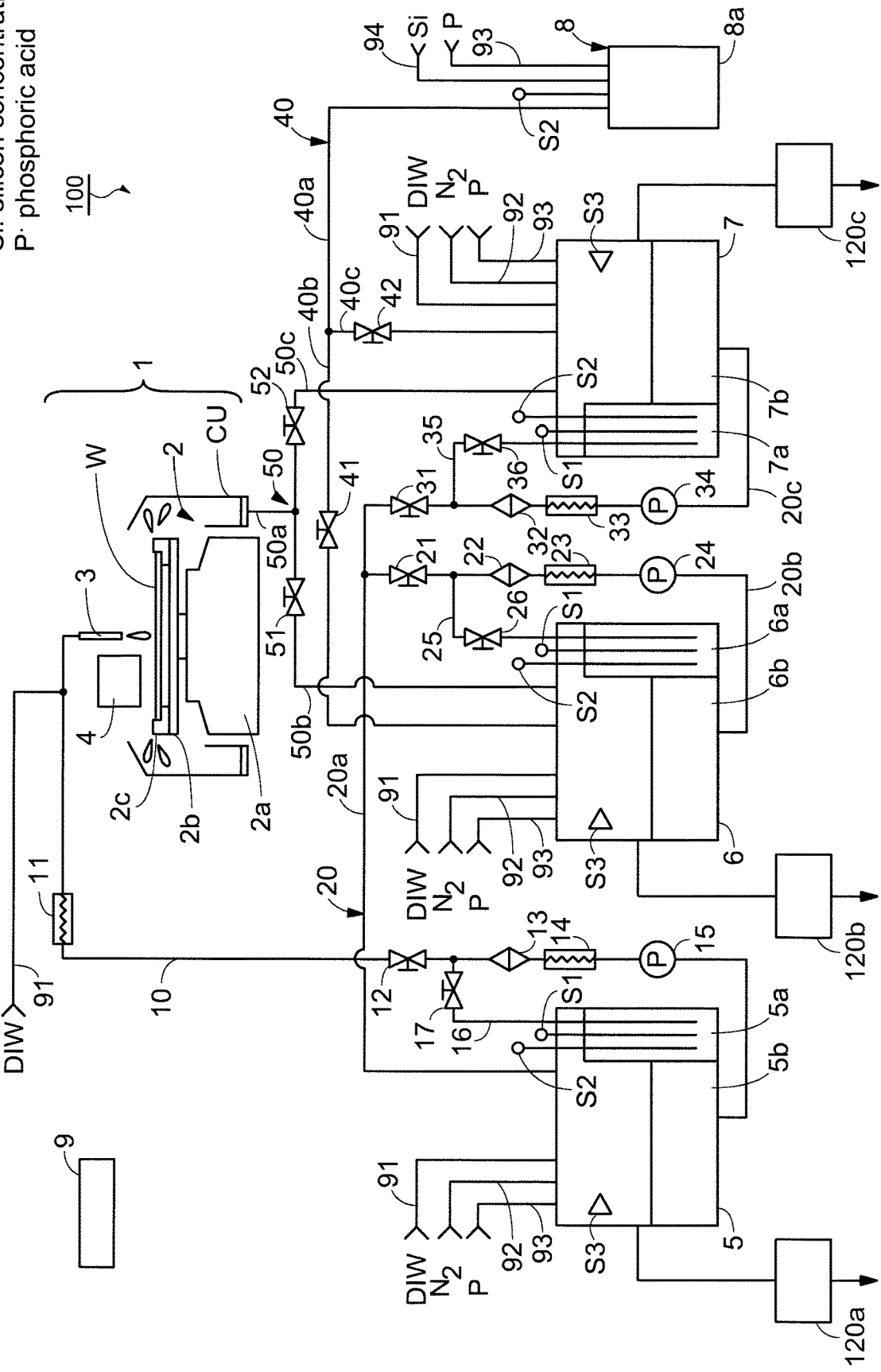

SEMICONDUCTOR MANUFACTURING DEVICE

CROSS REFERENCES TO RELATED APPLICATION(S)

This application is based upon and claims the benefit of priority from the prior Japanese Patent Application No. 2019-153183, filed on Aug. 23, 2019, the entire contents of which are incorporated herein by reference.

FIELD

Embodiments described herein relate generally to a semiconductor manufacturing device.

BACKGROUND

Conventionally, the substrate processing device has been used to perform various processes such as etching and substrate cleaning of various substrates such as semiconductor wafers, glass substrates for photomasks, substrates for displays, and substrates for optical disks. The substrate processing device includes Batch type that processes multiple substrates simultaneously, and Single Wafer Type that processes a single individual substrate. In the single wafer type substrate processing device, a chemical solution in which concentration, temperature, and the like have been adjusted is discharged on the substrate.

BRIEF EXPLANATION OF THE DRAWINGS

FIG. 3 is a graph showing operation 1 of a semiconductor manufacturing device according to one embodiment of the present invention (a graph relating to the atmospheric pressure in a chemical solution preparation tank and the opening of the valve);

FIG. 4 is a diagram showing operation 2 of a semiconductor manufacturing device according to one embodiment of the present invention;

FIG. 5 is a graph showing operation 2 of a semiconductor manufacturing device according to one embodiment of the present invention (a graph relating to the atmospheric pressure in a chemical solution preparation tank and the concentration of the chemical solution); and FIG. 6 is an overall configuration diagram of a semiconductor manufacturing device according to one embodiment.

DESCRIPTION OF EMBODIMENTS

Figure 1:
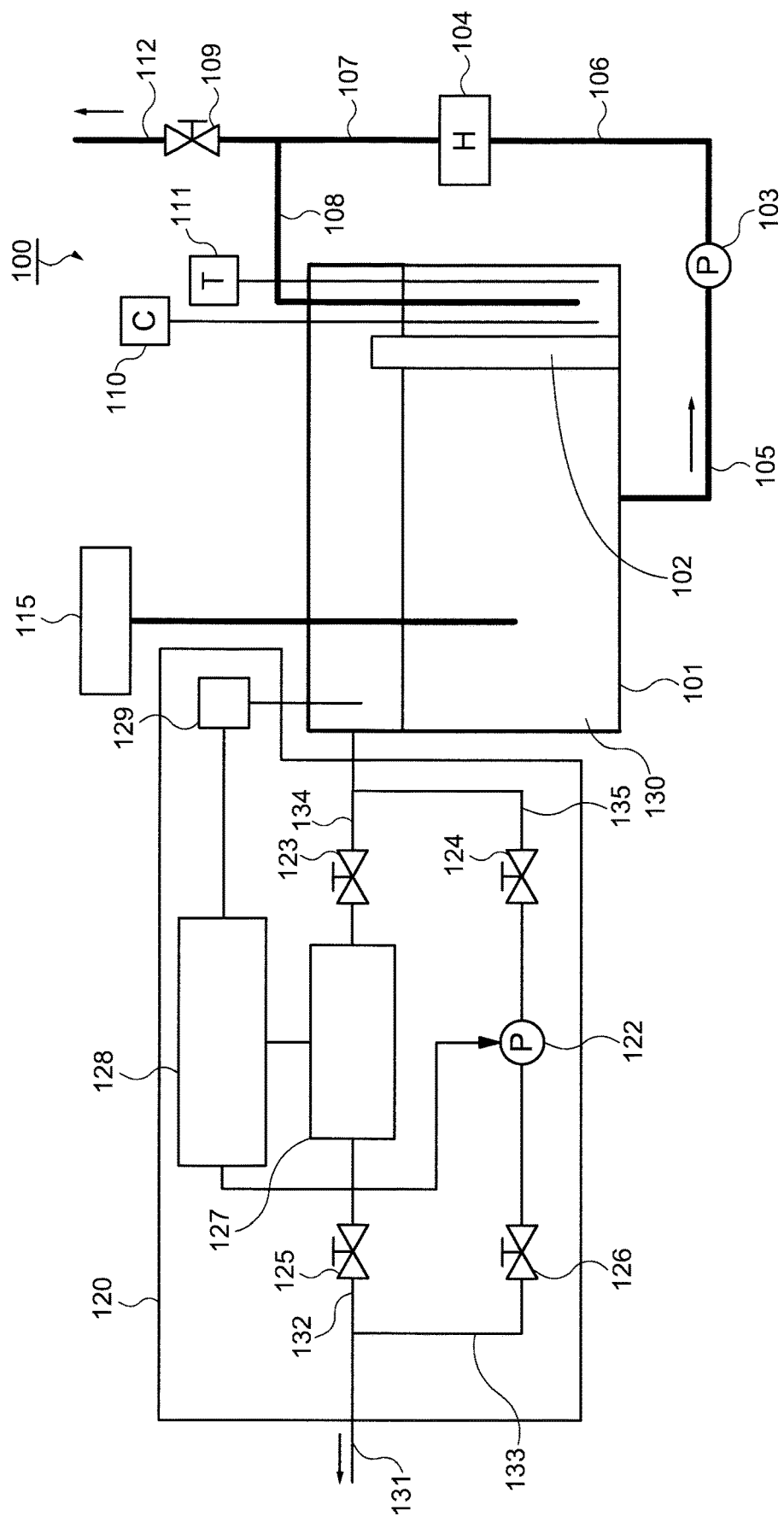
FIG. 1 is a diagram showing a configuration of a chemical solution preparation tank and various devices connected thereto of a semiconductor manufacturing device according to one embodiment of the present invention.

A semiconductor manufacturing device according to one embodiment of the present invention comprises: a chemical solution preparation tank configured to prepare a chemical solution; a chamber configured to discharge the chemical solution prepared at the chemical solution preparation tank to a substrate; a pressure sensor configured to measure a pressure inside the chemical solution preparation tank; and a variable opening valve arranged between the chemical solution preparation tank and an exhaust pipe.

Hereinafter, a semiconductor manufacturing device according to the present embodiment will be described in detail by referring to the drawings. In the following description, constituent elements having substantially the same functions and configurations are denoted by the same reference numerals, and duplicate description will be given only when necessary. Each of the embodiments described below exemplifies a device and a method for embodying the technical idea of this embodiment, and the technical idea of the embodiment does not specify the material, shape, structure, arrangement, and the like of the component parts as follows. Various modifications can be made to the technical idea of the embodiment in the claims.

In order to make the description clearer, the drawings may be schematically represented with respect to widths, thicknesses, shapes, and the like of the respective portions compared with actual embodiments, but are merely an example and do not limit the interpretation of the present invention. In the specification and each drawing, elements having the same functions as those described with reference to the preceding figures are denoted by the same reference numerals, and a repetitive description thereof may be omitted.

[Configuration of a Chemical Solution Preparation Tank and its Peripheral Devices of a Semiconductor Manufacturing Device According to the Embodiment]

A configuration of a chemical solution preparation tank and its peripheral devices of a semiconductor manufacturing device according to the embodiment will be described with reference to FIG. 1.

The semiconductor manufacturing device according to the embodiment of the present invention is a single wafer substrate processing device, which is typically a cleaning device or an etching device. Although the type of the chemical solution used is not limited, it is typically a hot phosphoric acid aqueous solution of 80° C. or higher. The hot phosphoric acid aqueous solution etches a silicon nitride film while maintaining selectivity with an underlying silicon oxide film. When the concentration of the phosphoric acid is high, it becomes difficult to maintain the selectivity with respect to the silicon oxide film, and when the concentration of the phosphoric acid is low, the temperature need to be low for the boiling point is low, the etching rate is reduced and the productivity is deteriorated.

In many cases, a mixed solution of nitric acid and hydrofluoric acid is used for etching a silicon single crystal (substrate) or a silicon polycrystalline film, and the hydrofluoric acid is used for etching the silicon oxide film. Although not as much as the variations in the etching of the silicon nitride film, in both cases, the variations in the concentration lead to the variations in the process.

For cleaning of the silicon single crystals (substrate) or various thin films formed thereon, ammonia, hydrogen peroxide water and deionized water are used.

As shown in FIG. 1, the semiconductor manufacturing device 100 includes a chemical solution preparation tank 101, a circulation pump 103, a heater 104, a chemical solution providing device 115, and a tank pressure control unit 120.

A chemical solution 130 is put into the chemical solution preparation tank 101 from the chemical solution providing device 115. The chemical solution 130 is, for example, phosphoric acid aqueous solution. The Chemical solution preparation tank 101 further includes a concentration sensor 110 and a temperature sensor 111 in an area partitioned by a barrier 102. The chemical solution preparation tank 101 is connected to the circulation pump 103 by a pipe 105 and the circulation pump 103 is connected to the heater 104 by a pipe 106. The chemical solution 130 is heated by the heater 104 and returned to the chemical solution preparation tank 101 via a pipe 107 and a pipe 108. The pipe 107 is connected to a valve 109, and an end of the valve 109 is connected to a chamber (not shown) by a pipe 112. The chemical solution 130 is discharged on a substrate (e.g., a substrate having a silicon nitride film formed on a silicon dioxide film) in the chamber. In the present embodiment, the concentration sensor 110 is arranged in the chemical solution preparation tank 101. However, the present invention is not limited thereto, the concentration sensor 110 may be arranged in any of the pipes 105, 106, 107, 108.

A temperature of the chemical solution 130 is measured by the temperature sensor 111 and heated by the heater 104 until it reaches a set temperature. A concentration of the chemical solution 130 is measured by the concentration sensor 110. When the concentration is low, the heater 104 heats the chemical solution 130 to evaporate the water to increase the concentration. On the contrary, when the concentration is high, DIW (deionized water) or the chemical solution 130 having the concentration slightly lower than the set concentration is introduced by the chemical solution providing device 115.

The concentration sensor 110 is, for example, a back-pressure type level meter, which applies pressure from above to a tube inserted vertically into the liquid and measures the specific gravity by the height of the liquid level. The concentration of the chemical solution is calculated from the obtained specific gravity. Therefore, when the atmospheric pressure inside the chemical solution preparation tank 101 fluctuates, the accuracy of detecting the concentration of the chemical solution is deteriorated.

The tank pressure control unit 120 controls the atmospheric pressure inside the chemical solution preparation tank 101. A pipe 131 is connected to a common exhaust pipe of the facility where the semiconductor manufacturing device 100 is installed. Therefore, gas inside the chemical solution preparation tank 101 (which is usually air but may also be nitrogen or inert gas) is discharged to the common exhaust pipe of the facility via the pipe 131.

The tank pressure control unit 120 includes valves 123, 124, 125 and 126, a variable opening valve 127, a pump 122, a control device 128, a pressure sensor 129. The valve 123 is connected to a space above the chemical solution preparation tank 101 by a pipe 134. The valve 124 is connected to a space above the chemical solution preparation tank 101 by a pipe 135. The valve 125 is connected to the pipe 131 via a pipe 132. The valve 126 is connected to the pipe 131 via a pipe 133. The variable opening valve 127 is connected between the valve 123 and the valve 125. The pump 122 is connected between the valve 124 and the valve 126. Any valves 123, 124, 125 and 126 are controlled by the control device 128. The variable opening valve 127 and the pump 122 are also controlled by the control device 128.

The pressure sensor 129 detects the atmospheric pressure in the space above the chemical solution preparation tank 101, and a sensing signal is supplied to the control device 128. The pressure sensor 129 is, for example, a piezo resistance method of pressure sensor. A Si single-crystal plate is used as a diaphragm (pressure-receiving element) to form a resistance bridge circuit in which impurities are diffused on the surface of the diaphragm. The strain of the resistance bridge when pressure is applied is detected as a change in resistance and the pressure (atmospheric pressure) is calculated.

[Operation 1 of the Semiconductor Manufacturing Device According to One Embodiment]

Figure 2:
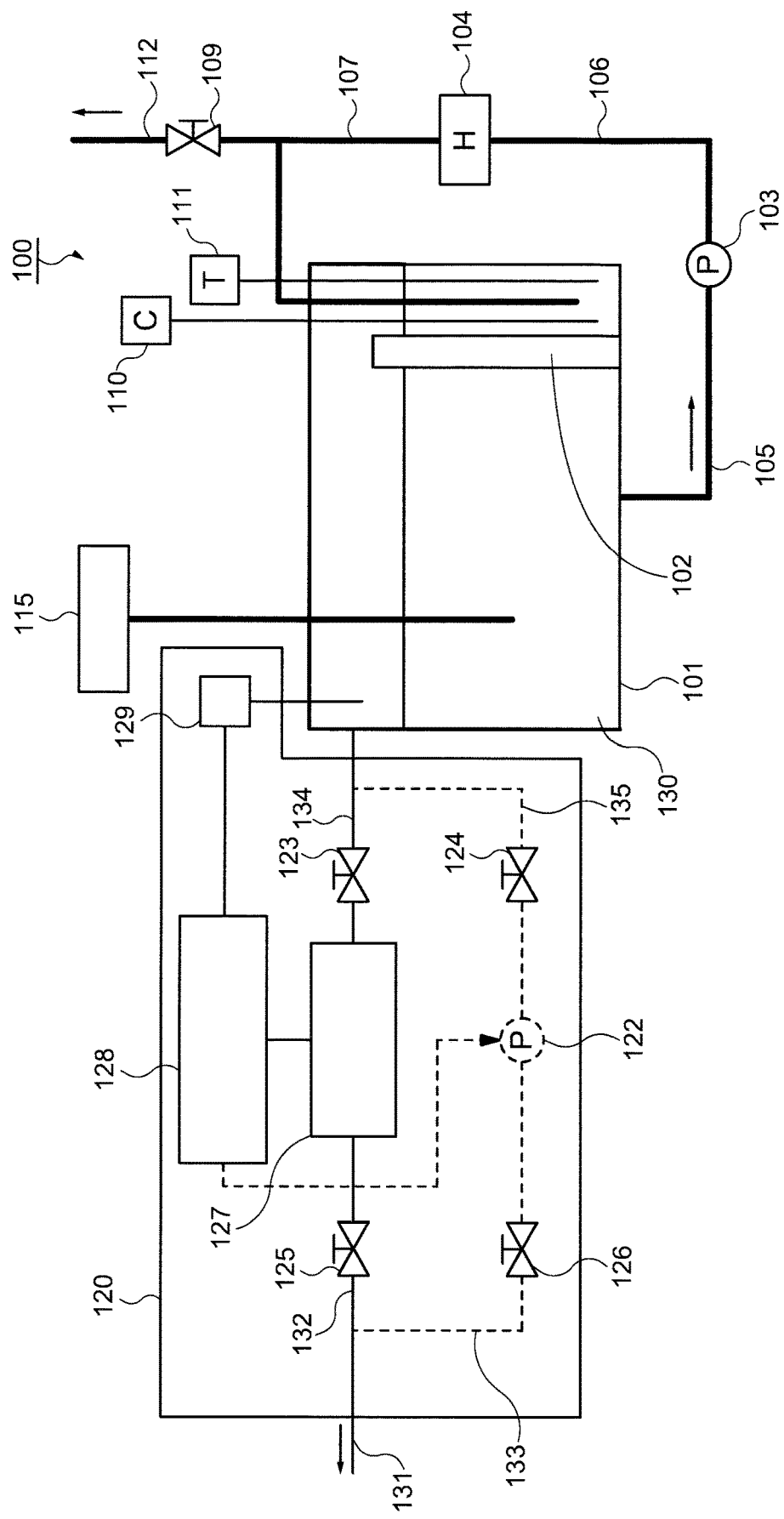
FIG. 2 is a diagram showing operation 1 of a semiconductor manufacturing device according to one embodiment of the present invention.

With reference to FIGS. 2 and 3, the operation 1 of the semiconductor manufacturing device according to the embodiment will be described. FIG. 2 is a diagram showing the operation 1 of the semiconductor manufacturing device according to the embodiment. The valve 124 and the valve 126 are closed and the pump 122 is not operating. As a result, the space above the chemical solution preparation tank 101 is connected to the common exhaust pipe of the facility via the pipe 134, the valve 123, the variable opening valve 127, the valve 125, the pipe 132, and the pipe 131.

FIG. 3 is a graph of the atmospheric pressure in the chemical solution preparation tank and the valve opening in operation 1 of the semiconductor manufacturing device according to the embodiment. The horizontal axis represents time t, the vertical axis represents atmospheric pressure p and opening o. The time t corresponds to one hour for one unit in the graph. Generally, the common exhaust pipe of the facility where the semiconductor manufacturing device 100 is installed is subject to varying the pressure. A large number of devices are connected to the common exhaust pipe, where the pressure of the common exhaust pipe may increase, for example, due to the operation of the unloading pump of another device. The pressure of the common exhaust pipe may drop during maintenance of another device.

Graph 150 (thin solid line) in FIG. 3 is an example of the change in atmospheric pressure of the common exhaust pipe. At certain times, the atmospheric pressure increases or decreases. If the tank pressure control unit 120 does not exist and the inside of the chemical solution preparation tank 101 is directly connected to the common exhaust pipe, the atmospheric pressure inside the chemical solution preparation tank 101 also fluctuates according to the fluctuation of the atmospheric pressure of the common exhaust pipe. As a result, the accuracy of detecting the concentration of the chemical solution of the concentration sensor 110 is lowered.

Graph 152 of FIG. 3 (dotted line) shows the opening o of the variable opening valve 127. When the pressure sensor 129 detects an increase in atmospheric pressure in the space above the chemical solution preparation tank 101, the control device 128 increases the opening o of the variable opening valve 127 accordingly. When the pressure sensor 129 detects a decrease in the atmospheric pressure in the space above the chemical solution preparation tank 101, the control device 128 decreases the opening o of the variable opening valve 127 accordingly. Graph 151 (thick solid line) in FIG. 3 shows the atmospheric pressure inside the chemical solution preparation tank 101. The atmospheric pressure in the space above the chemical solution preparation tank 101 is always kept constant by the feed-back control described above. As a result, the accuracy of detecting the concentration of the chemical solution of the concentration sensor 110 is always kept high.

[Operation 2 of the Semiconductor Manufacturing Device According to the Embodiment]

With reference to FIGS. 4 and 5, the operation 2 of the semiconductor manufacturing device according to the embodiment will be described. FIG. 4 is a diagram showing operation 2 of the semiconductor manufacturing device according to the embodiment. The valve 123 and the valve 125 are closed. As a result, the space above the chemical solution preparation tank 101 is connected to the common exhaust pipe of the facility via the pipe 135, the valve 124, the pump 122, the valve 126, the pipe 133, and the pipe 131.

FIG. 5 is a graph of an atmospheric pressure p and a chemical solution concentration c in the chemical solution preparation tank according to operation 2 of the semiconductor manufacturing device according to an embodiment. The horizontal axis represents time t, and the vertical axis represents atmospheric pressure p and concentration c. The time t corresponds to 15 minutes for one unit in the graph.

Graph 160 (bold dotted line) in FIG. 5 is a graph showing the pressure inside the chemical solution preparation tank 101 when the tank pressure control unit 120 does not exist and the inside of the chemical solution preparation tank 101 is directly connected to the common exhaust pipe. On the other hand, graph 161 in FIG. 5 shows the pressure inside the chemical solution preparation tank 101 when the pump 122 is operated for a predetermined period of time. When the pressure inside the chemical solution preparation tank 101 decreases, the rate of evaporation of the chemical solution increases, and as a result, the concentration also increases.

When the chemical solution is the phosphoric acid aqueous solution, the concentration (initial state concentration) of the phosphoric acid aqueous solution supplied from the chemical solution providing device 115 is, for example, 85%. The concentration is adjusted to, for example, 90% (target concentration) by heating the chemical solution of this initial state concentration to evaporate the water and concentrate the liquid. Graph 162 (dotted line) of FIG. 5 is a graph showing the time change of the density c of the chemical solution when the tank pressure control unit 120 does not exist and the inside of the chemical solution preparation tank 101 is directly connected to the common exhaust pipe. On the other hand, graph 163 (a thin solid line) of FIG. 5 is a graph showing the time change in the density c of the chemical solution when the pump 122 of the tank pressure control unit 120 is operated for a predetermined period to evacuate. As described above, by operating the pump 122 of the tank pressure control unit 120, the concentration c rises faster, and as a result, the target concentration can be adjusted in a shorter time than in the conventional case.

The pump 122 may operate for the predetermined period of time or may operate for a period of time until the concentration sensor 110 reaches the target concentration. In the latter case, the feedback control using the concentration sensor 110 is performed. This path is shown by the dotted line in FIG. 4.

[Overall Configuration of the Semiconductor Manufacturing Device]

FIG. 6 is an overall configuration diagram of the semiconductor manufacturing device according to the embodiment. As shown in FIG. 6, the semiconductor manufacturing device 100 includes a processing unit (chamber) 1, a first chemical solution preparation tank 5, a second chemical solution preparation tank 6, a third chemical solution preparation tank 7, a chemical solution providing device 8, and a control part 9. The first chemical solution preparation tank 5, the second chemical solution preparation tank 6, and the third chemical solution preparation tank 7 are provided with a first tank pressure control unit 120a, a second tank pressure control unit 120b, and a third tank pressure control unit 120c which are identical in configuration to the tank pressure control unit 120 described above.

The processing unit 1 includes a spin chuck 2, a liquid processing nozzle 3, a heating device 4 and a cup CU. In the processing unit 1, several substrates W are processed one by one.

The spin chuck 2 has a spin motor 2a, a spin base 2b and a plurality of chuck pins 2c. The spin motor 2a is arranged so that a rotating shaft is parallel to the vertical direction. The spin base 2b has a disk-shaped configuration and is mounted in a horizontal orientation at the upper end of the rotating shaft of the spin motor 2a. A plurality of chuck-pins 2c is arranged on the upper surface of the spin base 2b to hold a peripheral portion of the substrate W. The spin motor 2a operates with the plurality of chuck pin 2c holding the substrate W. As a result, the substrate W rotates around the vertical axis.

As described above, in the present embodiment, the mechanical spin chuck 2 that holds the peripheral portion of the substrate W is used. Not limited thereto, instead of the mechanical spin chuck, an adsorption type spin chuck to adsorb and hold the back surface of the substrate W may be used.

The liquid processing nozzle 3 and the heating device 4 are movably arranged between the upper position of the substrate W held by the spin chuck 2 and the waiting position on the side of the substrate W. The liquid processing nozzle 3 supplies the phosphoric acid aqueous solution supplied from the first chemical solution preparation tank 5 to the substrate W rotated by the spin chuck 2.

When the phosphoric acid aqueous solution is supplied from the liquid processing nozzle 3 to the substrate W, the heating device 4 is disposed at a position facing the upper surface of the substrate W. The heating device 4 includes a lamp heater which generates infrared ray and heats the processing liquid supplied to the substrate W and on the substrate W by radiant heat. As the lamp heater, for example, tungsten halogen lamp, xenon arc lamp or graphite heater or the like can be used.

Heating temperature of the substrate W by the heating device 4 is set to a temperature higher than the boiling point of the phosphoric acid aqueous solution of the phosphoric acid concentration (e.g., 140° C. or more and 160° C. or less). As a result, the temperature of the phosphoric acid aqueous solution on the substrate W rises to the boiling point of the phosphoric acid concentration, and the etching rate of the silicon nitride film by the phosphoric acid aqueous solution increases.

On the other hand, if the silicon concentration of the phosphoric acid aqueous solution is within appropriate ranges, the etching rate of the silicon oxide film by the phosphoric acid aqueous solution is kept sufficiently lower than the etching rate of the silicon nitride film. As a result, the silicon nitride film on the substrate W is selectively etched as described above.

The cups CU is arranged so as to surround the spin chuck 2. The cups CU are lowered when the substrate W is carried into the spin chuck 2 and when the substrate W is carried out from the spin chuck 2, and the cups CU are raised when the phosphoric acid aqueous solution is supplied to the substrate W.

When the phosphoric acid aqueous solution is supplied to the rotating substrate W, the upper end of the cup CU is located above the substrate W. Thereby the phosphoric acid aqueous solution shaken off the substrate W is received by the cup CU. The phosphoric acid aqueous solution received by the cup CU is sent to the second chemical solution preparation tank 6 or the third chemical solution preparation tank 7 as described later. As described above, these chemical solution preparation tanks are provided with the second tank pressure control unit 120b and the third tank pressure control unit 120c.

The first chemical solution preparation tank 5 includes a circulation tank 5a and a storage tank 5b. The circulation tank 5a and the storage tank 5b are arranged adjacent to each other, and are configured such that the fluid overflowing in one tank (e.g. the circulation tank 5a) flows into the other tank (e.g. the storage tank 5b). The circulation tank 5a is provided with a phosphoric acid densitometer S1 and a silicon densitometer S2. The phosphoric acid densitometer S1 outputs the phosphoric acid concentration of the phosphoric acid aqueous solution, and the silicon densitometer S2 outputs the silicon concentration of the phosphoric acid aqueous solution. The storage tank 5b is provided with a liquid level sensor S3 for outputting the liquid level of the phosphoric acid aqueous solution. A DIW supply system 91, a nitrogen (N2) gas supply system 92 and a phosphoric acid aqueous solution supply system 93 are connected to the storage tank 5b. As described above, the first chemical solution preparation tank 5 is provided with the first tank pressure control unit 120a having the same configuration as that of the tank pressure control unit 120.

A first supply pipe 10 is arranged to connect the storage tank 5b of the first chemical solution preparation tank 5 and the liquid processing nozzle 3 of the processing unit 1. The first supply pipe 10, from the storage tank 5b toward the liquid processing nozzle 3, a pump 15, a heater 14, a filter 13, the valve 12 and a heater 11 are interposed in this order.

A circulation pipe 16 is arranged to connect the portion of the first supply pipe 10 between the filter 13 and the valve 12 with the circulation tank 5a. The circulation pipe 16, a valve 17 is interposed. The DIW supply system 91 is connected to the portion of the first supply pipe 10 between the heater 11 and the liquid processing nozzle 3.

Each of the second and third chemical solution preparation tanks 6, 7 has the same configuration as the first chemical solution preparation tank 5 and includes circulation tanks 6a, 7a and storage tanks 6b, 7b. Each of the circulation tanks 6a and 7a is provided with the phosphoric acid densitometer S1 and the silicon densitometer S2. Each of the storage tanks 6b and 7b is provided with the liquid level sensor S3 and is connected to the DIW supply system 91, the nitrogen gas supply system 92, and the phosphoric acid aqueous solution supply system 93.

A second supply pipe 20 is arranged to connect the storage tank 5b of the first chemical solution preparation tank and the storage tanks 6b, 7b of the second and third chemical solution preparation tanks 6, 7. The second supply pipe 20 has one main pipe 20a and two branch pipes 20b, 20c. The branch pipes 20b, 20c are connected to the main pipe 20a. The main pipe 20a is connected to the storage tank 5b of the first chemical solution preparation tank 5 and the two branch pipes 20b, 20c are connected to the storage tanks 6b, 7b of the second and third chemical solution preparation tanks 6, 7, respectively.

One of the branch pipe 20b, toward the main pipe 20a from the storage tank 6b, a pump 24, a heater 23, a filter 22 and a valve 21 are interposed in this order. A circulation pipe 25 is arranged to connect the portion of the branch pipe 20b between the filter 22 and the valve 21 with the circulation tank 6a. The valve 26 is interposed in the circulation pipe 25.

The other branch pipe 20c, toward the main pipe 20a from the storage tank 7b, a pump 34, a heater 33, a filter 32 and a valve 31 are interposed in this order. A circulation pipe 35 is arranged to connect the portion of the branch pipe 20c between the filter 32 and the valve 31 with the circulation tank 7a. The valve 36 is interposed in circulation pipe 35.

A recovery pipe 50 is arranged to connect the cup CU of the processing unit 1 to the storage tanks 6b, 7b of the second and third chemical solution preparation tanks 6, 7. The recovery pipe 50 has one main pipe 50a and two branch pipes 50b, 50c. The branch pipes 50b, 50c are connected to the main pipe 50a. The main pipe 50a of the recovery pipe 50 is connected to the cup CU, and the two branch pipes 50b, 50c are connected to the storage tanks 6b, 7b of the second and third chemical solution preparation tanks 6, 7, respectively. A valve 51 is inserted into the branch pipe 50b, and a valve 52 is inserted into the branch pipe 50c.

The chemical solution providing device 8 has a providing device for providing a liquid in a mixed chemical solution preparation tank 8a and the mixed chemical solution preparation tank 8a thereof to the outside. The phosphoric acid aqueous solution supply system 93 and a silicon (Si) concentrate supply system 94 are connected to the chemical solution providing device 8. The mixed chemical solution preparation tank 8a is provided with the silicon densitometer S2.

Within the mixed chemical solution preparation tank 8a of the chemical solution providing device 8, the phosphoric acid aqueous solution and silicon concentrate supplied from the phosphoric acid aqueous solution supply system 93 and the silicon concentrate supply system 94 are mixed at a predetermined ratio. Thereby, the phosphoric acid aqueous solution having a predetermined silicon concentration (hereinafter, referred to as a reference silicon concentration) is generated as a new processing liquid and held at a predetermined temperature. In this embodiment, a liquid in which silicon fine particles are dissolved in the phosphoric acid aqueous solution is used as a silicon concentrate.

In the chemical solution providing device 8, it is also possible to adjust the silicon concentration in the mixed chemical solution preparation tank 8a to a value different from the reference silicon concentration. For example, the silicon concentrate is added into the mixed chemical solution preparation tank 8a while the phosphoric acid aqueous solution having the reference silicon concentration is stored in the mixed chemical solution preparation tank 8a. Thereby, the silicon concentration in the mixed chemical solution preparation tank 8a can be higher than the reference silicon concentration. The phosphoric acid aqueous solution is added in the mixed chemical solution preparation tank 8a with the phosphoric acid aqueous solution having the reference silicon concentration in the mixed chemical solution preparation tank 8a stored therein. Thereby, the silicon concentration in the mixed chemical solution preparation tank 8a can be made lower than the reference silicon concentration.

A third supply pipe 40 is arranged to connect the chemical solution providing device 8 and the storage tanks 6b, 7b of the second and third chemical solution preparation tanks 6, 7. The third supply pipe 40 has one main pipe 40a and two branch pipes 40b, 40c. The branch pipes 40b, 40c are connected to the main pipe 40a. The main pipe 40a of the third supply pipe 40 is connected to the chemical solution providing device 8, and the two branch pipes 40b, 40c are connected to the storage tanks 6b, 7b of the second and third chemical solution preparation tanks 6, 7, respectively. A valve 41 is inserted into the branch pipe 40b, and a valve 42 is inserted into the branch pipe 40c.

The control part 9 includes a CPU (central processing unit) and a memory, or a microcomputer or the like. A system program is stored in the memory of the control part 9. The control part 9 controls the operation of the respective components of the semiconductor manufacturing device 100.

For example, the control part 9 switches the open and closed states of the valves 12, 17, 21, 26, 31, 36, 41, 42, 51, 52 based on the height of liquid level outputted from the liquid level sensor S3. The control part 9 controls the DIW supply system 91, the nitrogen gas supply system 92 and the phosphoric acid aqueous solution supply system 93 based on the phosphate concentration output from each of the phosphoric acid densitometer S1. The Control part 9 controls the chemical solution providing device 8, the phosphoric acid aqueous solution supply system 93 and the silicon concentrate supply system 94 based on the silicon concentration output from each of the silicon densitometer S2.

With the above configuration, the first tank pressure control unit 120*a*, the second tank pressure control unit 120*b*, and the third tank pressure control unit 120*c* perform the operation of the operation 1 described above, whereby the atmospheric pressure inside the first chemical preparation tank, the second chemical preparation tank, and the third chemical preparation tank is kept constant regardless of the atmospheric pressure of the common exhaust pipe, and as a result, the concentration of the chemical can be strictly controlled. In particular, the third tank pressure control unit 120*c* can quickly prepare the chemical solution in the third chemical solution preparation tank by performing the operation 2 described above.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor manufacturing device comprising:
   a chemical solution preparation tank configured to prepare a chemical solution;
   a chamber configured to discharge the chemical solution prepared at the chemical solution preparation tank to a semiconductor wafer;
   a pressure sensor configured to measure a pressure inside the chemical solution preparation tank; and
   a variable opening valve arranged between the chemical solution preparation tank and an exhaust pipe.

2. The semiconductor manufacturing device according to claim 1, further comprising:
   a control device configured to control the variable opening valve according to a measurement result of the pressure sensor.

3. The semiconductor manufacturing device according to claim 2, wherein the control device is further configured to increase the opening of the variable opening valve when the pressure sensor detects an increase in pressure in the chemical solution preparation tank, and is further configured to decrease the opening of the variable opening valve when the pressure sensor detects a decrease in pressure in the chemical solution preparation tank.

4. The semiconductor manufacturing device according to claim 1, further comprising:
   a concentration sensor configured to measure a concentration of the chemical solution, the concentration sensor arranged in the chemical solution preparation tank,
   wherein an accuracy of the concentration sensor is affected by the pressure of the chemical solution preparation tank.

5. The semiconductor manufacturing device according to claim 1, wherein the chemical solution is used to etch the semiconductor wafer or clean the semiconductor wafer in the chamber.

6. The semiconductor manufacturing device according to claim 1, wherein
   the chemical solution is phosphoric acid aqueous solution, and
   the chemical solution is used to etch a silicon nitride film formed on the semiconductor wafer in the chamber.

7. A semiconductor manufacturing device comprising:
   a chemical solution preparation tank configured to prepare a chemical solution;
   a chamber configured to discharge the chemical solution prepared at the chemical solution preparation tank to a semiconductor wafer; and
   a pump arranged between the chemical solution preparation tank and an exhaust pipe.

8. The semiconductor manufacturing device according to claim 7, further comprising:
   a control device configured to operate the pump for a predetermined time to lower the pressure of the chemical solution preparation tank to promote evaporation of water from the chemical solution and increase a concentration of the chemical solution.

9. The semiconductor manufacturing device according to claim 7, further comprising:
   a concentration sensor configured to measure a concentration of the chemical solution, the concentration sensor arranged in the chemical solution preparation tank; and
   a control device to control an operation of the pump according to a measured result of the concentration sensor.

10. The semiconductor manufacturing device according to claim 9, wherein the control device operates the pump until the concentration sensor reaches a target concentration to lower the pressure of the chemical solution preparation tank to promote evaporation of water from the chemical solution and increase a concentration of the chemical solution.

11. The semiconductor manufacturing device according to claim 9, further comprising:
    a chemical solution providing device configured to introduce a chemical solution into the chemical solution preparation tank,
    wherein the chemical solution providing device introduces deionized water or the chemical solution having a concentration lower than a set concentration when a chemical concentration detected by the concentration sensor is high.

12. The semiconductor manufacturing device according to claim 9, further comprising:
    a heater configured to heat the chemical solution in the chemical solution preparation tank,
    wherein the heater heats the chemical solution to promote evaporation of water from the chemical solution and increase a concentration of the chemical solution.

13. The semiconductor manufacturing device according to claim 12, further comprising:
    a temperature sensor configured to measure a temperature of the chemical solution in the chemical solution preparation tank,
    wherein the heater heats the chemical solution until the temperature of the chemical solution detected by the temperature sensor reaches a set temperature.

14. The semiconductor manufacturing device according to claim 7, wherein the chemical solution is used to etch the semiconductor wafer or clean the semiconductor wafer in the chamber.

15. The semiconductor manufacturing device according to claim 7, wherein the chemical solution is phosphoric acid aqueous solution, the chemical solution is used to etch a silicon nitride film formed on the semiconductor wafer in the chamber.

16. The semiconductor manufacturing device according to claim 7, further comprising:
 a pressure sensor configured to measure a pressure inside the chemical solution preparation tank; and
 a variable opening valve arranged between the chemical solution preparation tank and an exhaust pipe.

17. The semiconductor manufacturing device according to claim 16, further comprising:
 a control device configured to control the variable opening valve according to a measurement result of the pressure sensor.

18. The semiconductor manufacturing device according to claim 17, wherein the control device is further configured to increase the opening of the variable opening valve when the pressure sensor detects an increase in pressure in the chemical solution preparation tank, and is further configured to decrease the opening of the variable opening valve when the pressure sensor detects a decrease in pressure in the chemical solution preparation tank.

* * * * *